Figure 1:
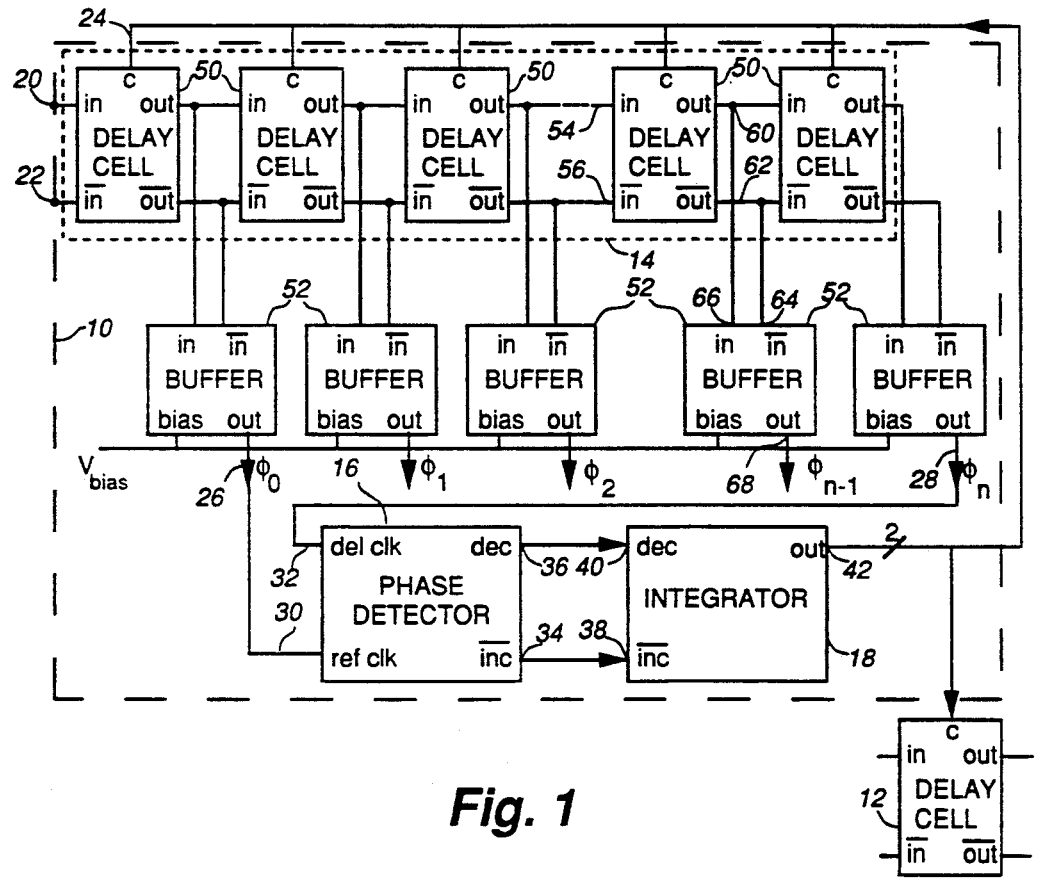

United States Patent [19]

Searles et al.

[11] Patent Number: 5,146,121

[45] Date of Patent: Sep. 8, 1992

[54] SIGNAL DELAY APPARATUS EMPLOYING A PHASE LOCKED LOOP

[75] Inventors: Shawn Searles, Ottawa; Richard G. Kusyk, Kanata, both of Canada

[73] Assignee: Northern Telecom Limited, Montreal, Canada

[21] Appl. No.: 782,353

[22] Filed: Oct. 24, 1991

[51] Int. Cl.$^5$ .................. H03K 5/13; H03K 5/159
[52] U.S. Cl. ..................... 307/603; 307/608; 307/262; 307/55; 307/155
[58] Field of Search ............... 307/608, 605, 591, 595, 307/594, 603, 299.2, 602, 606, 493, 494, 497, 262; 330/253, 51, 251; 331/1 A; 328/55, 155

[56] References Cited

U.S. PATENT DOCUMENTS

| | | | |
|---|---|---|---|
| 4,494,021 | 1/1985 | Bell et al. | 307/606 |
| 4,641,048 | 2/1987 | Pollock | 307/608 |
| 4,795,923 | 1/1989 | Dobos | 307/608 |
| 4,922,141 | 5/1990 | Lofgren et al. | 307/603 |
| 4,994,687 | 2/1991 | Fujii et al. | 307/602 |
| 5,059,838 | 10/1991 | Motegi et al. | 307/606 |
| 5,066,877 | 11/1991 | Hamano et al. | 307/608 |

Primary Examiner—Stanley D. Miller
Assistant Examiner—Toan Tran
Attorney, Agent, or Firm—Dallas F. Smith

[57] ABSTRACT

An apparatus is provided for delaying digital data signals by fixed amounts within an integrated circuit. A delay lock loop includes an adaptive delay line, a phase detector and an integrator. The integrator provides control signals $c_p$, $c_n$ for controlling the delay line, in dependence upon the relative phase of a reference clock signal $\phi_0$ and a delayed clock signal $\phi_n$. The delay line includes a plurality of delay cells. By maintaining a phase relationship $\phi_n = \phi_0 + 360°$ one clock cycle, $T_c$, delay through the delay line is provided. Thus each delay cell provides $T_c/n$ delay. By placing identical cells in signal paths elsewhere on a chip, fixed delays can be introduced which are controlled by the delay lock loop.

5 Claims, 2 Drawing Sheets

SIGNAL DELAY APPARATUS EMPLOYING A PHASE LOCKED LOOP

This invention relates to an apparatus for providing a plurality of phase-shifted clock signals from a reference clock signal using a delay lock loop (DLL) and is particularly concerned with providing a fixed delay cell controlled by the DLL for introducing fixed delays in the data signals.

Silicon BiCMOS integrated circuits introduce wide time differences or deltas between their best case propagation delays and their worst case propagation delays. The deltas are primarily due to operating temperature variation, supply voltage variation and chip processing variation. The variability of the delays means that standard delay elements can not be relied upon to provide a fixed time delay as the delay elements are themselves subject to the same variations. A delay line is required that compensates for propagation delays resulting from operating temperature variation, supply voltage variation and chip processing variation.

An object of the present invention is to provide an improved circuit for providing substantially constant delays in signal paths within an integrated circuit.

In accordance with an aspect of the present invention there is provided a circuit for providing an on-chip substantially constant delay in a signal path, comprising: a delay cell within the signal path requiring a substantially constant delay, the delay cell including a differential amplifier; and a delay lock loop for maintaining the substantially constant delay through the delay cell; the delay lock loop including: a delay line comprising a plurality of delay cells identical to the delay cell within the signal path, an input for a reference clock signal, and an output for providing a delayed clock signal; a phase detector connected to the delay line and having outputs indicative of a required increase and decrease of delay of the delayed clock signal relative to the reference clock signal; a charge pump connected to the phase detector and having a capacitor for providing an output signal therefrom; and a bias generator having an input connected to the charge pump output and two outputs for providing control signals $C_p$ and $C_n$; the differential amplifier comprising a CMOS differential amplifier whose pullup and pulldown currents are controlled by control signals $C_p$ and $C_n$, respectively.

Figure 2:
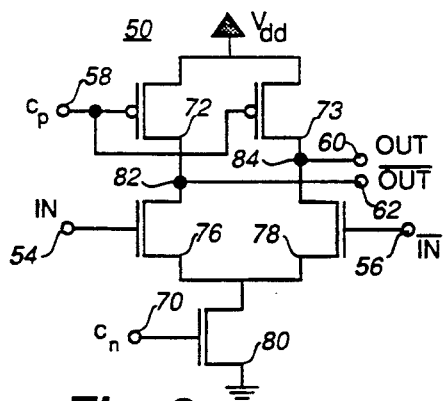
Figure 3:
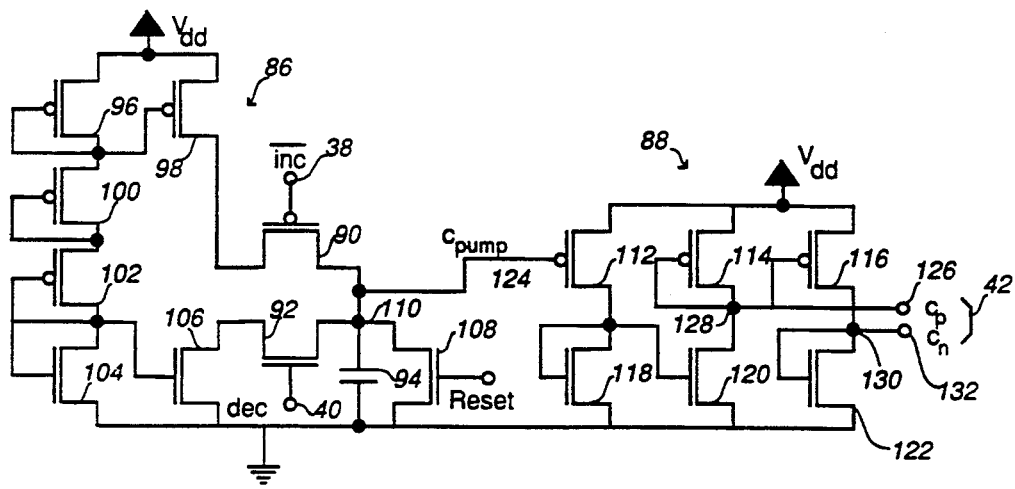
Figure 4:
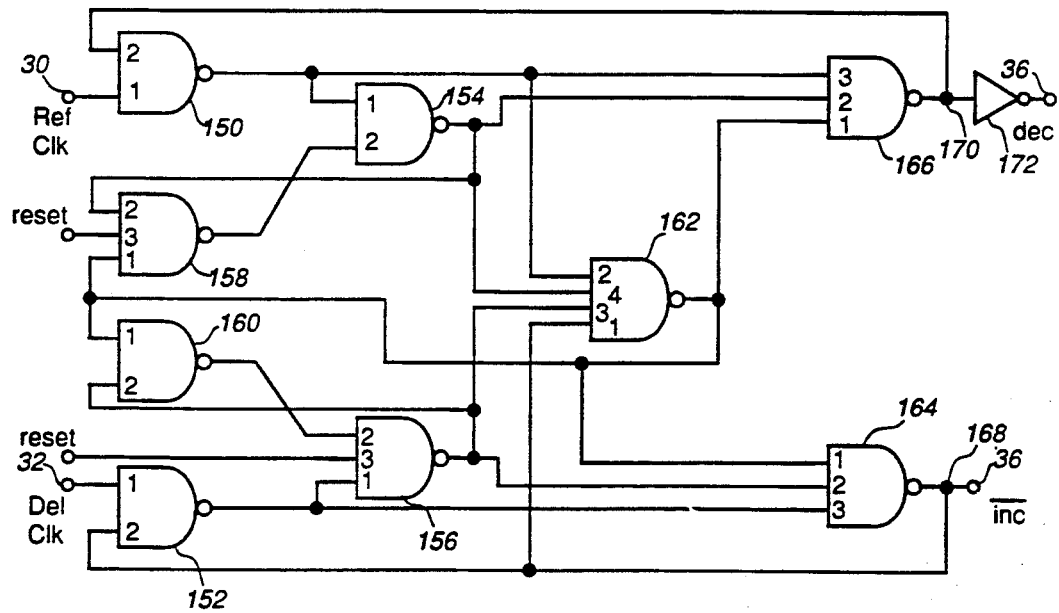

The present invention will be further understood from the following description with reference to the drawings in which:

FIG. 1 illustrates in block diagram a circuit for providing a constant delay in accordance with an embodiment of the present invention;

FIG. 2 schematically illustrates the delay cell of FIG. 1;

FIG. 3 schematically illustrates the integrator of FIG. 1;

FIG. 4 illustrates the phase detector of FIG. 1; and

Figure 5:
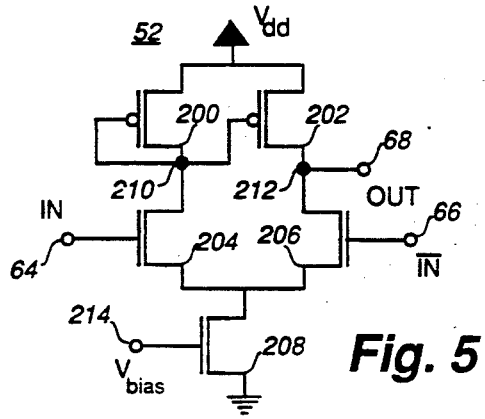

FIG. 5 schematically illustrates the buffer of FIG. 1.

Referring to FIG. 1, there is illustrated in a block diagram a circuit for providing a constant delay, in accordance with an embodiment of the present invention.

The circuit includes a delay lock loop (DLL) 10 and a delay cell 12. The DLL 10 includes an adaptive delay line 14, a phase detector 16, and a ,integrator 18. The delay line 14 has clock and threshold inputs 20 and 22, respectively, a control input 24, and at least two clock outputs, 26 and 28, providing clock phases $\phi_O$ and $\phi_n$, respectively. The clock outputs 26 and 28 are coupled to the phase detector 16 inputs 30 and 32, respectively. The input 30 is for receiving a reference clock input and the input 32 is for receiving a delayed clock input. The phase detector 16 has outputs 34 and 36 for indicating a required increase or decrease in clock phase. The outputs 34 and 36 are coupled to corresponding increase and decrease inputs 38 and 40 of the integrator 18. The integrator 18 has an output 42 coupled to the control input 24 of the delay line 14 for controlling the time delay thereof.

The delay line 14 includes n+1 delay cells 50 and n+1 buffers 52. Each delay cell 50 comprises a differential amplifier including noninverting and inverting inputs 54 and 56, a control input 58, and noninverting and inverting outputs 60 and 62. Each buffer 52 includes noninverting and inverting inputs 64 and 66 and a single output 68. The buffers 52 convert the differential outputs, 60 and 62, of the delay cells 50 to single outputs 68 and present a constant output capacitance to the delay cells.

In operation, the delay line 14 provides one clock cycle of delay between clock outputs 26 and 28, thus, $\phi_O + 360° = \phi_n$. The DLL 10 including the delay line 14, the phase detector 16 and the integrator 18 controls the delay line 14 to maintain the phase relationship of $\phi_O$ and $\phi_n$, over varying conditions of operating temperature, manufacturing process, and voltage supply. When such conditions cause a difference between $\phi_O$ and $\phi_n$, the phase detector 16 senses the phase change and signals an increase or decrease in phase, as appropriate, via outputs 34 and 36, respectively. The integrator 18 responds to the signal at input 38 or 40 by providing control signals $c_p$, $c_n$ at the output 42. The control signals $c_p$ and $c_n$ are applied to the delay line 14 via the control input 24 to increase or decrease the delay provided by the delay line 14. Hence, the delay line 14 is controlled to provide a one clock cycle delay independent of variations in temperature, voltage, and process. Consequently, each delay cell within the delay line 14 provides a constant delay interval $T_c/n$, where $T_c$ is the reference clock period and n is the number delay cells between clock outputs 26 and 28.

The delay cell 12, which is not a part of the delay line 14, but is identical to the delay cell 50 described hereinabove, is also controlled by the control signals $c_p$, $c_n$. Hence, the delay cell 12 can be placed anywhere on a chip to provide a fixed delay $T_c/n$ within a signal path. Similarly, a plurality of m delay cells can be series connected to provide a delay of $m(T_c/n)$. The delay cell 14 can also be used to multiply the reference clock frequency by XORing the clock with a delayed clock.

The delay line 14 can be used in conjunction with a multiplexer and a phase selector to provide any one of n phase-shifted reference clocks.

Referring to FIG. 2, there is schematically illustrated the delay cell in accordance with an embodiment of the present invention. The delay cell 50 is a CMOS differential amplifier including PMOS transistors 72 and 73 and NMOS transistors 76, 78, and 80. The noninverting input 54 and inverting input 56 are connected to the gates of NMOS transistors 76 and 78, respectively. The noninverting output 60 and the inverting output 62 are connected to nodes 82 and 84 between PMOS and NMOS transistors 72 and 76, and 73 and 78, respectively. The control signals $c_p$ and $c_n$ are applied to control inputs 58 and 70, respectively. The input 58 is connected to the gates of PMOS transistors 72 and 73. The input 70 is connected to the gate of NMOS transistor 80.

In operation, the delay through the delay cell 50 results from the charging and discharging of the capacitances on the nodes 82 and 84. The delay through the delay cell 50 can be altered by adjusting both the tail current INMOS and the pullup current IPMOS through the control signals $c_n$ and $c_p$, respectively. The control signal $c_p$ is applied to the gates of the PMOS transistors 72 and 73 via the control input 58. The control signal $c_n$ is applied to the gate of the NMOS transistor 80 via the control input 70.

A ratio $I_{PMOS}/I_{NMOS} = \frac{1}{2}$ and a 2× pulldown by the NMOS transistor 80, have been found to provide satisfactory operation over all control voltages. The delay cell 50 requires $I_{PMOS}$ and $I_{NMOS}$ operate in a nonsaturated state over all control voltages. The control voltage swing is 0 V to Vdd. The control signals $c_p$ and $c_n$ are described in connection with FIG. 3.

Referring to FIG. 3 there is schematically illustrated the integrator in accordance with an embodiment of the present invention. The integrator 18 comprises a charge pump 86 and a bias generator 88. The charge pump 86 includes PMOS transistors 90, 96, 98, 100, and 102 and NMOS transistors 92, 104, 106, and 108 connected as shown in FIG. 3. The increase input 38 is connected to the gate of PMOS transistor 90 and the decrease input 40 is connected to the gate of NMOS transistor 92. The increase and decrease inputs 38 and 40 are used to control the charging and discharging of a capacitor 94 connected between a node 110 and ground. The voltage of the capacitor 94 at the node 110 provides an output signal $c_{pump}$ which is used to control the bias generator 88. The NMOS transistor 108 has a reset input connected to its gate.

The bias generator comprises PMOS transistors 112, 114, and 116 and NMOS transistors 118, 120, and 122 connected as shown in FIG. 3. The control output signal $c_{pump}$ is applied to the PMOS transistor 112 via its gate 124. The control signals $c_p$ and $c_n$ are provided via outputs 42 including line 126 connected to a node 128 and line 130 connected to a node 132. The node 128 links the PMOS transistor 114 and the NMOS transistor 120 and has connected to it the gate of the PMOS transistors 114 and 116. The node 132 links the PMOS transistor 116 and the NMOS transistor 122 and has connected to it the gate of NMOS transistor 122.

In operation, the phase detector 16 provides either an increase or decrease signal to inputs 38 and 40, respectively, of the charge pump 86. The presence of an increase signal at the input 38 causes the PMOS transistor 90 to conduct current thereby increasing a charge on the capacitor 94 and raising the voltage at the node 110 which provides the control signal $c_{pump}$. Conversely, the presence of a decrease signal at the input 40 causes the NMOS transistor 92 to conduct current thereby decreasing the charge on the capacitor 94, and lowering the voltage at the node 110. The voltage at the node 110 is applied to the gate 124 of the PMOS transistor 112. Resultant voltages at nodes 128 and 130, the gate voltages of PMOS transistors 114 and 116 and NMOS transistor 122, respectively, become the control signals $c_p$ and $c_n$, respectively.

Referring to FIG. 4, there is illustrated the phase detector in accordance with an embodiment of the present invention. The phase detector 16 consists of a well known nine NAND gate circuit, the nine gates (150–166) connected in a symmetrical arrangement as shown in FIG. 4. The numbering of the inputs of the NAND gates indicate the speed of the inputs, No. 1 being the fastest input (the input connected to the transistor closest to the output).

The NAND gates 150 and 152 have the reference clock input 30 and the delayed clock input 32 connected to their respective No. 1 inputs. The outputs of NAND gates 164 and 166 are connected to nodes 168 and 170, respectively. The increase output 34, (inc), is connected directly to the node 168. The decrease output 36, (dec), is connected to the node 170 via an inverter 172.

The on-chip layout of the phase detector is important. The symmetry of the device must be preserved. The NAND gate 162 must drive out in a symmetrical manner. Also, the connection of Ref Clk input 30 to the node 170 and Del Clk input 32 to the node 168 should be longer than the connection from the NAND gate 162 to the node 170.

The last block of FIG. 1 to be described in detail is the buffer 52. Referring to FIG. 5, there is schematically illustrated the buffer of FIG. 1, in accordance with an embodiment of the present invention. The buffer 52 includes PMOS transistors 200 and 202 and NMOS transistors 204, 206, and 208 connected as shown in FIG. 5. The gates of PMOS transistors 200 and 202 are connected to a node 210. The node 210 links PMOS transistor 200 to NMOS transistor 204. The noninverting input 64 and the inverting input 66 are connected to the gates of NMOS transistors 204 and 206, respectively. The output 68 is connected to a node 212. The node 212 links the PMOS transistor 202 and the NMOS transistor 206. The NMOS transistor 208 is used to set the pulldown current under the control of $V_{bias}$ at its gate 214. In operation, the bias voltage $V_{bias}$ can be the same as $c_n$ in which case the buffer 52 provides a delay similar to the delay cell 50. If less delay is desirable in the buffer and power consumption is not a concern, $V_{bias}$ can be raised to reduce the delay in the buffer 52.

Numerous modifications, variations and adaptations may be made to the particular embodiment of the invention described above without departing from the scope of the invention, which is defined in the claims.

What is claimed is:

1. A circuit for providing an on-chip substantially constant delay in a signal path, comprising:
   a delay cell within the signal path requiring a substantially constant delay, the delay cell including a CMOS differential amplifier having pullup and pulldown currents being controlled by first and second control signals, respectively; and
   a delay lock loop for maintaining the substantially constant delay through the delay cell;
   the delay lock loop including:
      a delay line comprising a plurality of serially connected delay cells identical to the delay cell within the signal path, an input for receiving a reference clock signal, and an output for providing a delayed clock signal; a phase detector connected to receive the delayed clock signal and the reference clock signal and having outputs indicative of a phase difference between the delayed clock signal relative to the reference clock signal;
      a charge pump connected to the outputs of the phase detector and having a capacitor for providing an output signal therefrom; and a bias generator having an input connected to receive the output signal of the charge pump for providing the first and second control signals.

2. A circuit as claimed in claim 1 wherein the delay line includes differential input to signal output buffers each connected to the output of one of the delay cells.

3. A circuit as claimed in claim 2 wherein the buffers include a bias input for varying delay through the buffer.

4. A circuit as claimed in claim 1 wherein the phase difference between the delayed clock signal and the reference clock signal is about 360°.

5. A circuit as claimed in claim 4 wherein the delayed clock signal has a phase $\phi_n$, the reference clock signal is $\phi_O$, and the delay lock loop maintains a phase relationship defined by $\phi_n = \phi_O + 360°$.

* * * * *